May 31, 1960 M. GENSER 2,938,819

INTERMETALLIC SEMICONDUCTOR DEVICE MANUFACTURING

Filed Aug. 15, 1958

INVENTOR
MILTON GENSER

BY Alvin J. Riddle
ATTORNEY 2,938,819

INTERMETALLIC SEMICONDUCTOR DEVICE MANUFACTURING

Milton Genser, Linden, N.J., assignor to International Business Machines Corporation, New York, N.Y., a corporation of New York Filed Aug. 15, 1958, Ser. No. 755,299

5 Claims. (Cl. 148—1.5)

This invention relates to a semiconductor devices and, in particular, to semiconductor device manufacturing, employing as the semiconductor crystal, materials of the class known as intermetallic compounds.

It has developed in the art that combinations of metals may form compounds having physical properties such that, with the addition of conductivity directing impurities, they may exhibit the properties of semiconductors. These semiconductor materials are referred to in the art as intermetallic compounds. One of the better known of these compounds is the three-five group of intermetallic compounds. These compounds are binary compounds of an element of the third group with an element of the fifth group of the periodic system of elements such as, for example, indium antimonide, aluminum antimonide, indium arsenide, aluminum arsenide, and gallium arsenide. These semiconductor compounds are distinguished by high carrier mobility, that is, the ability of the electrons and holes to migrate through the semiconductor material. Further information concerning the 3–5 group semiconductor compounds may be had from the following example references: British Patent 763,348, published December 12, 1956, and "Intermetallic Semiconductors" by H. J. Hrostowski, Bell Laboratories' Record, July 1956, pages 246–250.

While it has been found in the art that the physical properties of the 3–5 intermetallic compounds provide many advantages in semiconductor device structures, the technology involved in the providing of these structures to the degree of accuracy required to achieve the high speeds to which semiconductor devices are being subjected in the art has become increasingly difficult. The technology is especially difficult in the case of semiconductor devices wherein the conductivity type directing impurities are introduced by diffusion. As a particular example of a problem in the technology in the introduction of conductivity type directing impurities, temperatures must be employed by diffusion into indium arsenide that cause the compound to dissociate due to the characteristically high vapor pressure of the arsenic.

A technique of semiconductor device manufacturing involving specific impurity materials has been discovered which greatly simplifies the operations involved in diffusion for three-five intermetallic semiconductor compounds and, at the same time, by the choice of the impurity materials in accordance with the invention, semiconductor structures may be fabricated in a shorter number of steps with relaxation of environmental tolerances. This is accomplished in the technique of this invention by providing a combination of alloying and diffusing from the alloy region into the three-five intermetallic semiconductor crystal wherein specific impurity materials which have physical properties such that their tendency to segregate and to diffuse cooperate so that, in a single heating cycle, the diffusion operation takes place at one temperature which provides a first zone in the semiconductor crystal and a segregation operation takes place on cooling providing a second opposite conductivity type zone in the semiconductor material.

It is an object of this invention to provide an improved technique of intermetallic semiconductor device manufacture.

It is another object of this invention to provide a simplified alloying and diffusion technique for intermetallic semiconductor devices.

It is still another object of this invention to provide a method of making three-five intermetallic semiconductor NPN transistors.

It is a related object of this invention to provide a technique for forming a rectifying connection in an intermetallic semiconductor body in a single heating cycle.

Other objects of the invention will be pointed out in the following description and claims and illustrated in the accompanying drawings, which disclose, by way of example, the principle of the invention and the best mode, which has been contemplated, of applying that principle.

Figure 1:
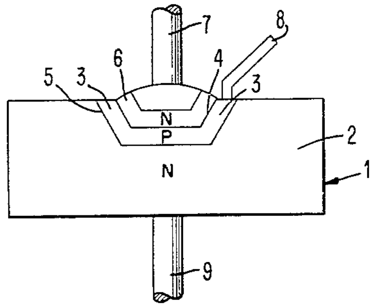
Figure 1 is an illustration of a transistor made according to the technique of this invention.

Referring now to Figure 1, an NPN "drift" transistor structure is shown as an example of the type of semiconductor device which may be fabricated from three-five intermetallic compounds in accordance with the technique of this invention. The structure comprises a three-five intermetallic semiconductor body 1, for example, gallium arsenide, indium phosphide, or aluminum antimonide. The body 1 comprises a collector region 2, having N conductivity type, which may be imparted to the intermetallic compound of the body 1 through the introduction of appropriate quantities of conductivity type determining impurities, such as, selenium or tellurium.

A base region 3 of P conductivity type is provided having a gradient of resistivity which varies from the value which is high adjacent to the collector region 2 and decreases to a value which is low adjacent to an emitter junction 4. The collector junction of the transistor of Figure 1 is shown as element 5. A recrystallized region 6 of N conductivity type is shown serving as the emitter of the transistor of Figure 1 and ohmic connections 7, 8 and 9, respectively, are made to the emitter, base and collector regions of the transistor.

The transistor of Figure 1 has the advantages of a graded collector resistivity for high avalanche breakdown values and hence is able to handle high collector voltages, a graded resistivity base region to provide a "drift" field for rapid frequency response, and a low, constant resistivity, recrystallized emitter region which imparts high minority carrier injection efficiency to the device.

Such a device as that of Figure 1 in the prior art was generally fabricated through the use of a diffusion operation in order to provide the resistivity gradient in the base region whereby conductivity type determining impurities were introduced to form the region 3 by exposing the body 1 to a vapor having a closely controlled impurity concentration at a temperature very close to the melting point of the semiconductor material. This technique, in the case of the monoatomic semiconductor materials presented difficult problems with respect to contamination and concentration control in the vapor since too great a concentration would permit alloy formation. With the use of the intermetallic compounds, the problems encountered in the monoatomic technology were further complicated by the increase in the number of elements involved and each element having its own peculiar set of physical properties which must not conflict during the steps of the process with the physical properties of the other elements.

Figure 2:
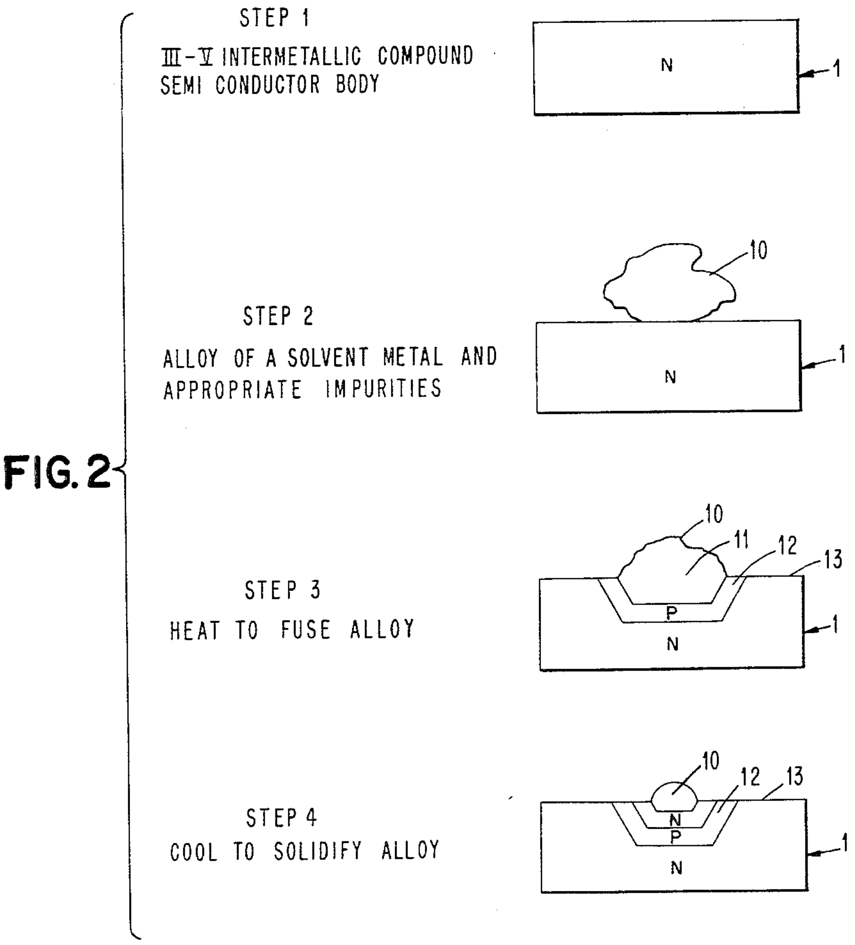
Figure 2 is an illustrated flow chart describing the individual steps of the technique of this invention.

Referring now to Figure 2, the technique of applicant's intermetallic semiconductor device manufacturing is shown in the form of an illustrated flow chart in which, in a first figure, a three-five N conductivity type intermetallic compound semiconductor body 1 is provided. The body 1 may be of any suitable shape or any suitable sub-assembly shape for later fabrication into desired device arrangements and has been here illustrated as a simple rectangular slab. The designation of N conductivity type indicates a predominance of donor conductivity type directing impurities, for example, selenium or tellurium, in the three-five intermetallic compound crystal. In intermetallic compounds, conductivity type determining impurities are employed that are not taken from the same column of the periodic table of the elements as the metals of the compound. For three-five intermetallic compounds, they are usually group six for donors and group two for acceptors.

In a second step, an alloy 10 of tin as a solvent metal and small quantities of N and P conductivity type directing impurities is brought into contact with the three-five intermetallic compound semiconductor body. The alloy is made up of a carrier metal which, in this example, has been chosen as tin. It has been found that acceptor elements, for example, zinc or aluminum, will diffuse more rapidly in three-five intermetallic compounds than will the donor elements selenium or tellurium. At the same time, it has been found that the selenium or tellurium will segregate more rapidly from a melt as solidification takes place in a step to be later explained than does the zinc or aluminum.

Consequently, the alloy suitable for practicing this invention may be made up of a solvent metal capable of melting and dissolving some of the body 1 at a temperature less than the melting temperature of the body 1 and is relatively inert with respect to imparting conductivity type to the body 1, and the appropriate donor and acceptor conductivity type determining impurities. Tin has been found to serve effectively as a solvent metal. Examples of alloys useful in performing the invention may be seen in the following table:

| | Percent |
|---|---|
| Alloy 1: | |
| Tin metal | 99.8 |
| Zinc | 0.1 |
| Selenium | 0.1 |
| Alloy 2: | |
| Tin metal | 99.8 |
| Zinc | 0.1 |
| Tellurium | 0.1 |
| Alloy 3: | |
| Tin metal | 99.8 |
| Aluminum | 0.1 |
| Selenium | 0.1 |
| Alloy 4: | |
| Tin metal | 99.8 |
| Aluminum | 0.1 |
| Tellurium | 0.1 |

Since it is well known in the art that the concentration of a particular conductivity type impurity in a melt may override the effect of the diffusion and segregation coefficients, it is necessary to maintain the concentrations of the two conductivity type directing impurities relatively equal.

In a third step, heat is applied to the combination of the alloy and the semiconductor crystal to a point where the alloy fuses and forms a molten pool in the surface of the semiconductor crystal. A molten pool of the alloy 10 is shown as element 11 in the illustration connected with step 3. As a particular example on a body 1 of indium antimonide, the alloy 1 will form a molten pool 11 above 400° C.

It will be apparent at this point that the heat necessary to fuse the alloy of the semiconductor compound is far lower than that necessary for such operations as diffusion as practiced heretofore in the art so that thermal stresses are reduced and problems involving the physical characteristics of the various elements involved are relaxed. The heat necessary to maintain the alloy in a fused condition is maintained for a period of time sufficient to control the amount of actual diffusion of the conductivity type directing impurity, which diffuses more rapidly and, consequently, a greater region is traversed by a predominance of opposite conductivity type directing impurities. In the illustration, the P type impurity diffuses into the crystal and forms a region labelled P designated by the numeral 12 in the figure associated with step 3, forming a PN junction 13. This junction 13 corresponds to the PN junction 5 of the structure of the Figure 1.

In a fourth step, the combination of the body 1 and the molten pool 10 is cooled to the point where the molten pool 10 solidifies. During this process, as the alloy solidifies, the higher segregation coefficient of the N conductivity type impurity operates to cause a predominance of N conductivity type impurity in the recrystallized region which grows around the edges of the molten pool at the beginning of the solidification process, thereby imparting N conductivity type to this region. The solidified remainder of the alloy has retained the numerical designation of 10 for clarity purposes, although it no longer is a molten pool in this illustration and serves to facilitate a later ohmic contact such as 7 in Figure 1.

It will now be apparent what has occurred is that through the invention, in a single heating cycle, a graded resistivity diffused region of one conductivity type is formed in the crystal which may form a PN junction and, immediately behind and completely parallel with it, is a second PN junction defining the boundary of a recrystallized opposite conductivity type region, and, that since the P conductivity type region 12 was formed by diffusion, the gradient of resistivity will be such as to enhance the flow of minority carriers injected at the junction of the recrystallized N conductivity type region and the region 12. Such a structure has many advantages, known to one skilled in the art, an example of which is the transistor of Figure 1.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. The process of making a three-five intermetallic compound semiconductor device comprising the steps of placing a three-five intermetallic compound semiconductor body in contact with a quantity of an alloy comprising as a major constituent tin and substantially equal quantities of zinc and selenium heating said semiconductor body and said alloy to a temperature sufficient to melt said alloy and to dissolve a portion of said semiconductor body in said alloy for a time to permit a quantity of said selenium to diffuse in said semiconductor body to establish a conductivity type thereof in a predetermined region in cooling said semiconductor body thereby solidifying said alloy on said semiconductor body.

2. The process of making a three-five intermetallic compound semiconductor device comprising the steps of placing a three-five intermetallic compound semiconductor body in contact with a quantity of an alloy comprising as a major constituent tin and substantially equal quantities of zinc and tellurium heating said semiconductor body and said alloy to a temperature sufficient to melt said alloy and to dissolve a portion of said semiconductor body in said alloy for a time to permit a quantity of said tellurium to diffuse in said semiconductor body to establish a conductivity type thereof in a predetermined region in cooling said semiconductor body thereby solidifying said alloy on said semiconductor body.

3. The process of making a three-five intermetallic compound semiconductor device comprising the steps of placing a three-five intermetallic compound semiconductor body in contact with a quantity of an alloy comprising as a major constituent tin and substantially equal quantities of aluminum and selenium heating said semiconductor body and said alloy to a temperature sufficient to melt said alloy and to dissolve a portion of said semiconductor body in said alloy for a time to permit a quantity of said selenium to diffuse in said semiconductor body to establish a conductivity type thereof in a predetermined region in cooling said semiconductor body thereby solodifying said alloy on said semiconductor body.

4. The process of making a three-five intermetallic compound semiconductor device comprising the steps of placing a three-five intermetallic compound semiconductor body in contact with a quantity of an alloy comprising as a major constituent tin and substantially equal quantities of aluminum and tellurium heating said semiconductor body and said alloy to a temperature sufficient to melt said alloy and to dissolve a portion of said semiconductor body in said alloy for a time to permit a quantity of said tellurium to diffuse in said semiconductor body to establish a conductivity type thereof in a predetermined region in cooling said semiconductor body thereby solidifying said alloy on said semiconductor body.

5. The process of making a three-five intermetallic compound semiconductor device comprising the steps of heating a three-five intermetallic semiconductor body in contact with a quantity of an alloy comprising tin as a major constituent and two substantially equal minor constituents comprising an element of the group consisting of aluminum and zinc and an element of the group consisting of selenium and tellurium, at a temperature sufficient to melt said alloy and to dissolve a portion of said semiconductor body in said alloy for a time to permit the element of said group consisting of selenium and tellurium to diffuse into said semiconductor body to establish the conductivity type thereof in a predetermined region and cooling said semiconductor body to solidify said molten alloy.

References Cited in the file of this patent

UNITED STATES PATENTS

| | | |
|---|---|---|
| 2,817,609 | Waters | Dec. 24, 1957 |
| 2,836,521 | Longini | May 27, 1958 |
| 2,836,523 | Fuller | May 27, 1958 |

FOREIGN PATENTS

| | | |
|---|---|---|
| 751,408 | Great Britain | June 27, 1956 |